United States Patent [19]  [11] 4,322,642
Sugasawa  [45] Mar. 30, 1982

[54] FREQUENCY DISCRIMINATING CIRCUIT

[75] Inventor: Fukashi Sugasawa, Yokohama, Japan

[73] Assignee: Nissan Motor Company, Limited, Kanagawa, Japan

[21] Appl. No.: 120,097

[22] Filed: Feb. 11, 1980

[30] Foreign Application Priority Data

Feb. 16, 1979 [JP] Japan .................................. 54-15996

[51] Int. Cl.³ ............................................. H03K 9/06
[52] U.S. Cl. .................................... 307/522; 307/358; 307/360; 328/138; 328/140
[58] Field of Search ........................ 307/522, 358, 360; 328/140, 138

[56] References Cited
U.S. PATENT DOCUMENTS 3,497,816 2/1970 Fritz et al. ........................... 328/138
3,522,544 8/1970 Salduti et al. ....................... 328/138
3,594,588 7/1971 Evans et al. ........................... 307/522
4,217,506 8/1980 Sawyer et al. ....................... 307/360

Primary Examiner—John S. Heyman
Attorney, Agent, or Firm—Lowe, King, Price & Becker

[57] ABSTRACT

A first frequency-to-voltage converter responds to an input pulse signal and outputs a first signal, whose peaks are at a level varying according to the period of the input signal, and whose troughs are at a substantially constant level. A second frequency-to-voltage converter responds to the input signal and outputs a second signal, whose troughs are at a level varying according to the period of the input signal. A discriminating means then determines a frequency decrease in the input signal past a predetermined frequency by sensing a peak in the first signal above a first level and determines a frequency increase in the input signal past the predetermined frequency by sensing a trough in the second signal below a second level.

11 Claims, 11 Drawing Figures

FREQUENCY DISCRIMINATING CIRCUIT

BACKGROUND OF THE INVENTION

The present invention relates to a frequency discriminating circuit for determining whether the frequency of an input signal is higher or lower than a predetermined value.

In general, the engine speed of a vehicle, such as an automotive vehicle varies between 600 r.p.m. (when idling) and 6,000 r.p.m. (in high speed running).

Thus by sensing an electric signal having a frequency from 10 Hz to 100 Hz, it is possible to determine the rotational speed of the engine.

For example, in a device for controlling the number of cylinders supplied with fuel, a decrease in the engine speed during a split-cylinder mode of operation where some of the cylinders are not supplied with fuel is detected to return the engine to its full-cylinder mode of operation.

A conventional circuit, having a simple structure, for determining whether the frequency of an input signal in the range of frequencies mentioned above is higher or lower than a predetermined value is shown in FIG. 1. The circuit comprises a frequency-to-voltage converter (f/v converter) 1 and a comparator 2.

The f/v converter 1 includes a capacitor 3 and a resistor 4, connected in parallel, of which the one junction is connected to a voltage $+V$ of a power supply while the other junction is connected to an input terminal $1a$ through a diode 5 whose polarity is shown in the drawing.

At the output terminal $1b$, a voltage appears, corresponding to a frequency of an input signal applied to the input terminal $1a$. Reference numeral 2 denotes a comparator wherein the inverting input terminal $(-)$ is connected to the output terminal $1b$ while the non-inverting input terminal $(+)$ is connected to the junction between resistors 6 and 7. The comparator 2 compares the output voltage $E$ appearing at the output terminal $1b$ with a constant reference voltage $V_0$ obtained from division of the voltage $+V$ by the resistors 6 and 7 to produce an output signal which is high when the output voltage $E$ is below the reference voltage $V_0$.

The operation of the circuit shown in FIG. 1 will be described with reference to FIG. 2.

Suppose that the pulse signal shown in FIG. 2(a) is applied to the input terminal $1a$. When the voltage at the input terminal $1a$ changes from the voltage $+V$ to zero, the voltage $E$ at the output terminal $1b$ becomes zero, because, assuming that the resistance of the diode 5 is zero, the capacitor 3 is charged by a current flowing through the diode 5.

Next if the voltage at the input terminal $1a$ returns to $+V$, the voltage $E$ at the output terminal $1b$ does not immediately return to $+V$ because the diode 5 is cut off. Instead, therefore, the capacitor 3 and the resistor 4 form an R-C network, and the capacitor 3 discharges through the resistor 4, so that the output voltage $E$ finally reaches substantially $+V$.

However, since the output voltage $E$ is returned to zero by the next pulse, the peak value of the output voltage is determined by the width of the $+V$ pulse; the wider the pulse, and thus the lower the frequency of the input signal, the higher the peak value.

Suppose, without loss of generality, that the width of the zero voltage pulses in the input signal can be neglected. The output signal $E$ will reach the reference voltage $V_0$ a time $T_0$ after returning to zero, where the relation between $T_0$ and $V_0$ is determined by the time constant of the R-C network formed by the capacitor 3 and resistor 4.

Accordingly, if and only if the period of the input signal exceeds $T_0$, the output of the comparator (shown by (c) in FIG. 2) will contain zero volt pulses. Therefore by detecting these zero volt pulses it is possible to determine whether the input signal is above or below the predetermined frequency corresponding to $T_0$.

This circuit thus far described has, however, a disadvantage in so far as it is inconvenient to have to determine the state of the output signal by checking for zero volt pulses. It is preferable, and may often be essential to have an output signal which is maintained at zero throughout the period in which the frequency of the input signal is below the predetermined value. For this purpose integrating circuits and so forth may be incorporated into the circuit, but this leads to complications, and the response of the circuit is impaired.

In order to eliminate this problem, another frequency discriminating circuit has been proposed which comprises a f/v converter 11 and a comparator 12, as shown in FIG. 3. In this circuit, the f/v converter 11 further comprises a series circuit comprising a diode 9 and a resistor 8 connected between the power supply $+V$ and the cathode of a diode 5, and a capacitor 10 smaller in capacity than the capacitor 3 and connected between the input terminal $1a$ and the diode 5.

The input/output characteristics of this circuit are as follows.

Suppose that the capacity of the capacitor 3 is $C_1$ and that of the capacitor 10 is $C_2 (C_2 < C_1)$ in the circuit 11. Further suppose that the pulses shown in FIG. 2(a) are applied to the input terminal $1a$. When the voltage at the input terminal $1a$ is changed from $+V$ to zero by one of those pulses, the capacitors 3 and 10 are charged by an electric current flowing from the power supply $+V$ to the input terminal $1a$ through the capacitor 3, the diode 5 and the capacitor 10. As a result, the voltage $E$ at the output terminal $1b$ lowers from $V_1$ to $V_2$ where $V_1$ denotes the value of the output voltage $E$ just before the pulse was applied thereto (when the voltage at the input terminal $1a$ was $+V$).

In the event that there is no charge in the capacitor 3, such as, for example when a first pulse is applied to the input terminal $1a$ of which voltage is $+V$, $V_1 = +V$. On the contrary, in the event that the following pulse is applied to the input terminal $1a$ before the capacitor 3 is completely discharged after the application of the first pulse, the voltage $V_1 = +V - Q/C_1 < +V$ because of the electric charge $Q$ remaining in the capacitor 3.

If we let $V_2$ represent the voltage at the output terminal when the voltage at the input terminal $1a$ has just fallen from $V$ to zero, then $$V_2 = \frac{C_1}{C_1 + C_2} V_1 (V_2 < V_1)$$

If the voltage at the input terminal $1a$ returns from zero to $+V$, the capacitor 10 discharges through the resistor 8 and the diode 9. Also, the capacitor 3 discharges through the resistor 4 as is the case with FIG. 1. Since the capacity $C_2$ of the capacitor 10 is smaller than the that $C_1$ of the capacitor 3, the capacitor 10 discharges more rapidly than the capacitor 3.

Due to the discharging of the capacitor 3, the voltage E at the output terminal 1b gradually increases, with the wave form shown in FIG. 4. Here, $E=V_1$ denotes the voltage at the output terminal 1b when the voltage at the input terminal 1a is $+V$ and $E=V_2$ denotes the voltage at the output terminal 1b, which is proportional to the voltage $V_1$ and which is lower than the voltage $V_1$ when the output voltage E is held low by an input pulse.

Suppose that when a pulse is applied to the input terminal 1a, the output voltage E is lowered to the voltage $V_2=E_0$. When the voltage at the input terminal 1a returns to $+V$, the output voltage E gradually rises from $V_1=E_0$. When the following pulse is applied after a time $T_0$, the voltage E lowers from the voltage $V_1=E_1$ to $V_2=E_2$. Thereafter, when the voltage at the input terminal 1a returns to $+V$, the voltage E gradually increases from $V_1=E_2$. When another pulse is applied to the input terminal 1a after the same period of $T_0$, the output voltage lowers from the voltage $V_1=E_3$ to $V_2=E_4$.

If a further pulse is applied to the input terminal 1a after a longer period $t_1$ (when the period T of the input signal is increased), the voltage E lowers from $V_1=E_3'$ ($>E_3$) to $V_2=E_4'(>E_4)$. Accordingly, as clearly shown in FIG. 4, a characteristic is that according as the period T of the input signal increases, the peak values $V_1$ and $V_2$ of the output voltage E when the pulse is applied gradually increases.

In FIG. 4, even when the period T of the input signal does not vary from $t_0$, the peak values $V_1$ and $V_2$ of the voltage E increase. If the period T remains thereafter at $t_0$, the increments of the peak values $V_1$ and $V_2$ decreases. As a result, the output voltages becomes stable. When the period T is shorter than the stable value $t_0$ the peak values $V_1$ and $V_2$ of the voltage E decrease according to a change in the period.

Thus, the output voltage E of the f/v converter 11 takes the peak values $V_1$ and $V_2$ in accordance with the period of the input signal. These peak values are determined in accordance with the preceding peak voltages. For example, in FIG. 4, the voltage $V_1=E_3$ is determined in accordance with the period $t_0$ and $V_1=E_2$. Since the voltage $V_1=E_2$ is determined by the voltage $V_1=E_1$, the peak voltage $V_1=E_3$, corresponding to the period $t_0$, is determined in accordance with the preceding peak voltage $V_1=E_1$.

Referring to FIG. 5, when the pulse signal shown in FIG. 5(a) is applied to the input terminal 1a, the output voltage E will continue to oscillate between the upper and lower peak voltages $V_0$ and $V_0'$ as shown in FIG. 5(b), if the period is $T_0$.

If the pulse has a period T larger than $T_0$, the voltage E will exceed the voltage $V_0$. Accordingly, if the voltage $V_0$ is taken as a reference voltage for the comparator 12, the output voltage of the comparator 12 lowers as shown in FIG. 5(c). Thus, it is determined that the period has increased. It will be noted that, when the pulse has a larger period than $T_0$, the upper and lower peak voltages are raised as shown in FIG. 5(b).

After sensing this, if the reference voltage remains constant at $V_0$, the output voltage E appearing when a pulse is applied goes below the voltage $V_0$. Accordingly, in the FIG. 3 circuit, the output of the comparator 12 is applied through a resistor 13 to the reference input terminal (+) to lower the reference voltage to $V_0'$, whereby the output of the comparator 12 does not change even if the output voltage E of the f/v converter lowers. When the period of the input signal returns to $T_0$, the troughs in the output voltage E lowers at its lower limit to $V_0'$. As a result, the output of the comparator 12 returns to the initial high level.

Accordingly, with the frequency discriminating circuit shown in FIG. 3, it is possible to stably detect that the period of the input signal is longer than the predetermined value $T_0$, that is, that the frequency is lower than the predetermined value. Thus, although it is possible to solve the problem encountered with the circuit shown in FIG. 1, the following problem still remains.

In the FIG. 3 circuit, suppose that the period corresponding to the predetermined frequency is $T_0$ and the reference voltage of the comparator 12 is $V_0$. When the period T of the input signal varies slightly in the vicinity of the period $T_0$, such as, for example, as shown in FIG. 5, when the period T changes from a value slightly shorter than $T_0$ to a value slightly longer than $T_0$, it is possible to sense the change in the period T without any substantial delay.

On the other hand, as shown in FIG. 6(a), when the period of the input signal varies greatly from a value $T_1$ shorter than the period $T_0$ to a value T longer than the period $T_0$, it takes a considerable time until the output voltage E exceeds the reference voltage $V_0$, with the result that there occurs a response delay, as shown in FIG. 6(b).

The response delay time t is long when the period is short and then suddenly varies. As a result, within the predetermined frequency range, the above response delay is a serious problem, when there is a need to detect a lowering of the frequency (increase in the period).

SUMMARY OF THE INVENTION

With the above in view, an object of the present invention is to provide a frequency discriminating circuit which makes it possible to sense the frequency of an input signal with a short response time.

Another object of the present invention is to provide a frequency discriminating circuit particularly applicable to a split mode of operation of an engine.

BRIEF DESCRIPTION OF THE DRAWINGS

These and other objects, features and advantages of the present invention will become more apparent from the following description of the preferred embodiments thereof taken in conjunction with the accompanying drawings. Any one reference numeral designates similar or corresponding parts or members in all figures.

DETAILED DESCRIPTION OF THE INVENTION

Figure 1:
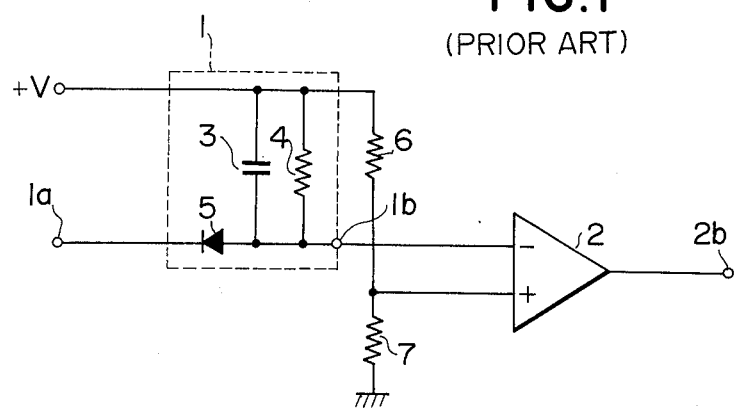
FIG. 1 is a circuit diagram of a conventional frequency discriminating circuit.
Figure 2:
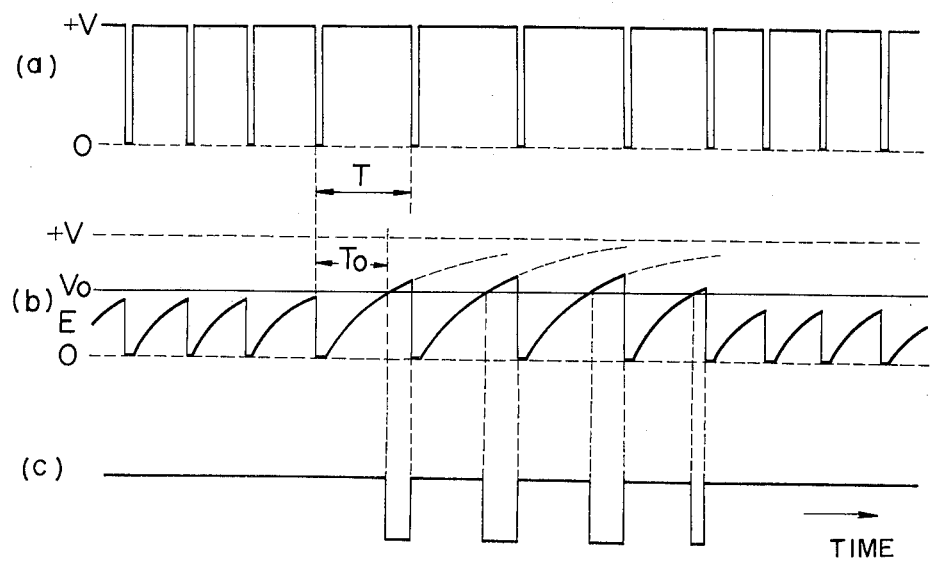
FIG. 2 is a time chart showing the input/output characteristics of the circuit shown in FIG. 1.
Figure 3:
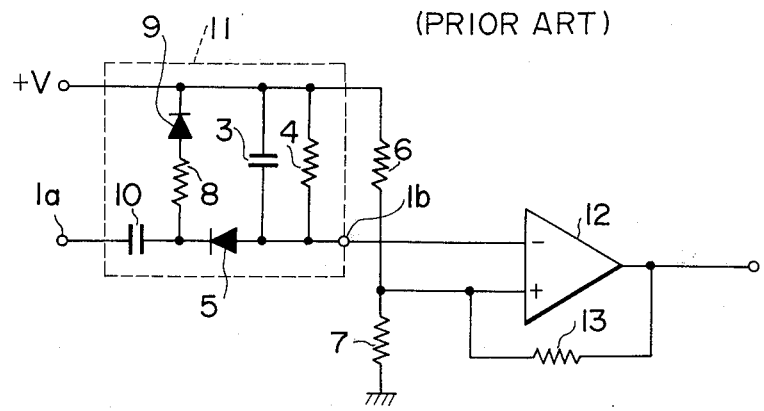
FIG. 3 is a circuit diagram of another conventional frequency discriminating circuit.
Figure 4:
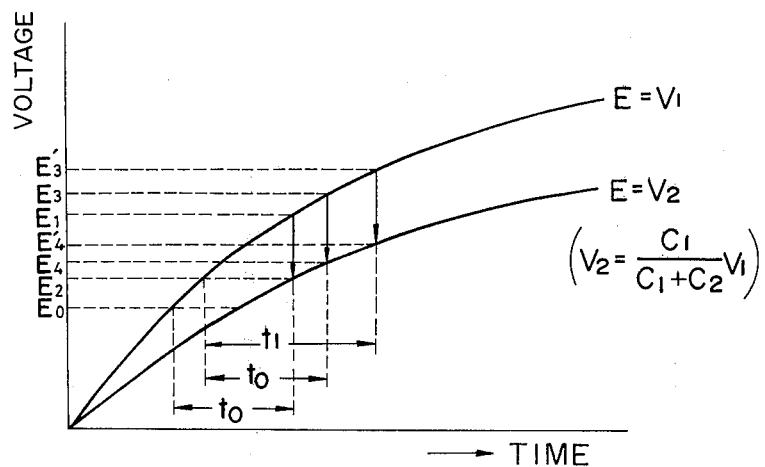
FIG. 4 shows the discharging characteristics of the output of the f/v converter shown in FIG. 3.
Figure 5:
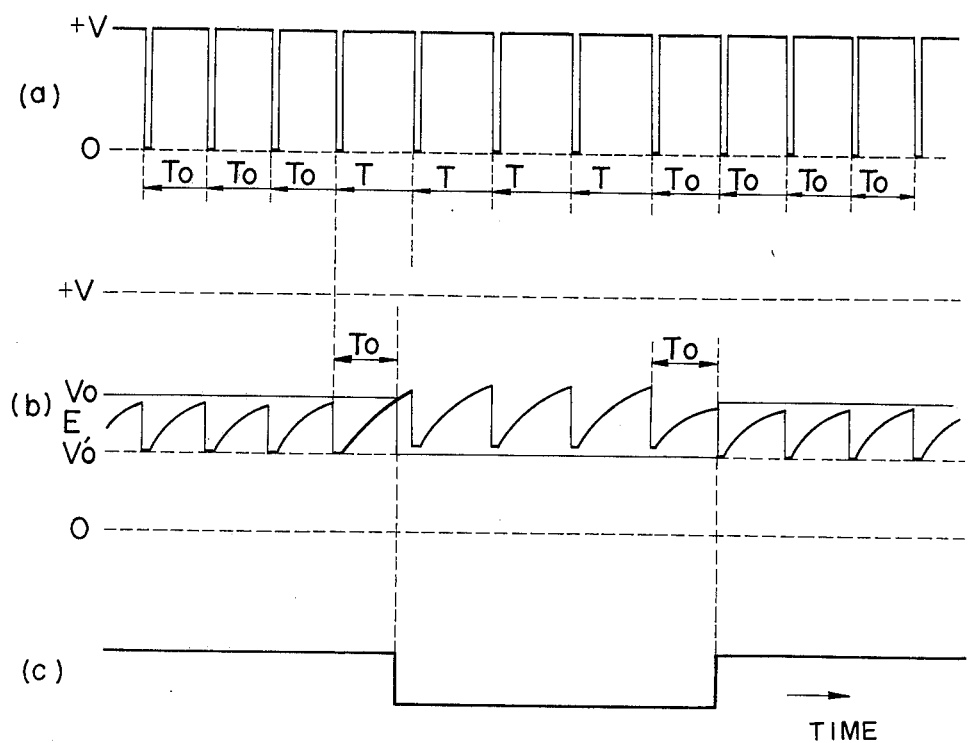
FIGS. 5 and 6 are the input/output characteristics of the circuit shown in FIG. 3.
Figure 6:
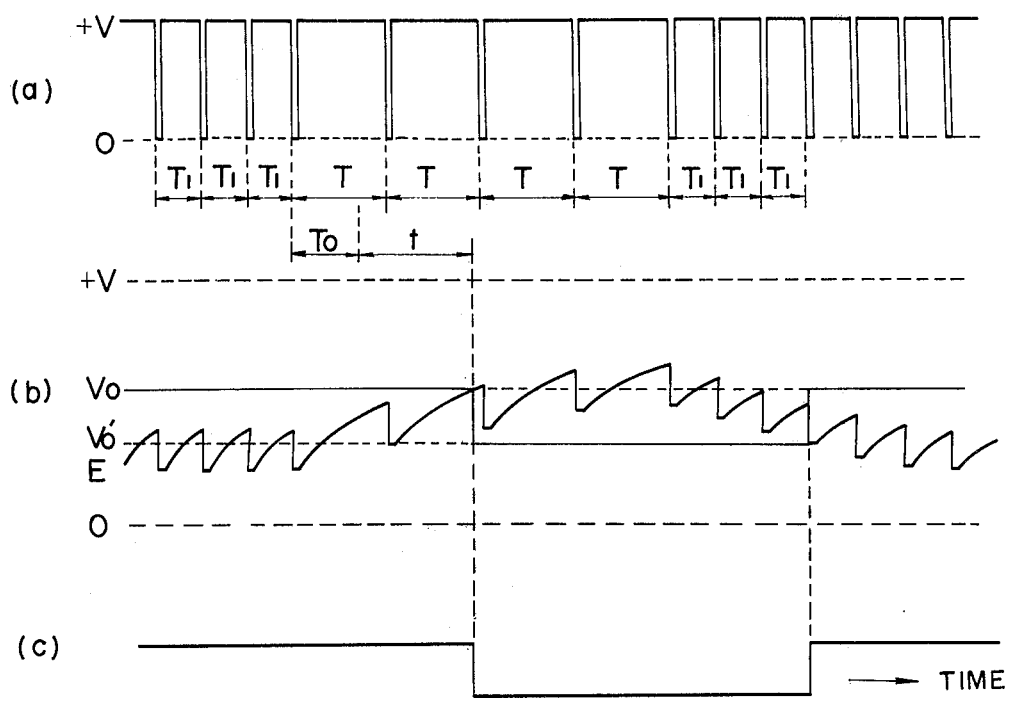
Figure 7:
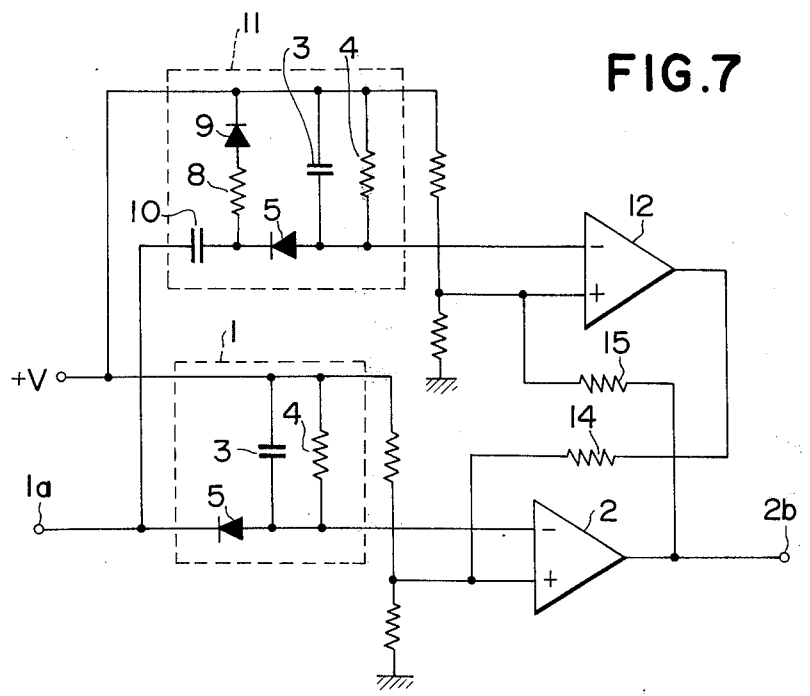
FIG. 7 is a circuit diagram of showing a first embodiment of the frequency discriminating circuit according to the present invention.

Referring to FIG. 7, a first embodiment of frequency discriminating circuit according to the present invention, comprises, in combination, a first circuit including a f/v converter 1 and a comparator 2, and a second circuit including a f/v converter 11 and comparator 12 both circuits themselves being the same as described above in FIGS. 1 and 3.

Reference numeral 1a denotes a common input terminal through which an input signal is applied to the first f/v converter 1 and the second f/v converter 11. Reference numeral 2b denotes the output terminal of the comparator 2.

The output terminal of the comparator 12 is connected to the non-inverting input terminal of the comparator 2 through a resistor 14. The output terminal of the comparator 2 is connected to the non-inverting input terminal of the comparator 12 through a resistor 15.

Figure 8:
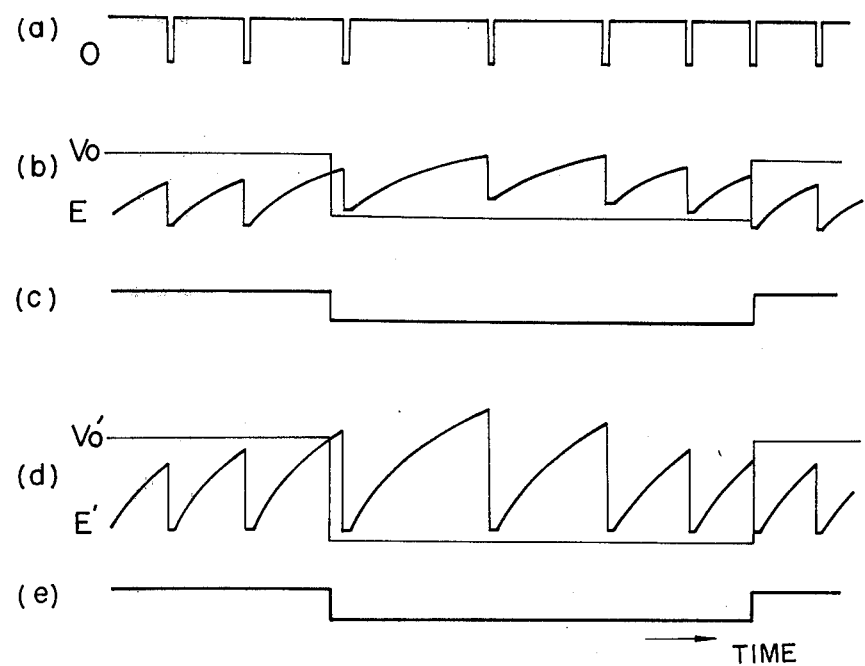
FIG. 8 shows the input/output characteristics of the circuit shown in FIG. 7.

In operation, suppose that the pulse signal shown in FIG. 8(a) is applied to the input terminal 1a. If the frequency of the input pulse signal lowers, that is, the period thereof increases, the output voltages E and E' of the f/v converters 11 and 1 rise as shown in FIGS. 8(b) and (d).

When the output voltage E' of the f/v converter 1 exceeds the reference voltage V'$_0$, the output voltage of the comparator 2 lowers as shown in FIG. 8(e). Thereby, the lowering of the frequency is detected.

At the same time, due to the lowering of the output voltage of the comparator 2, the reference voltage of the comparator 12 lowers to be below the output voltage E of the f/v converter 11. As a result, the output voltage of the comparator 12 lowers as shown in FIG. 8(c). Thereby, since the reference voltage V'$_0$ of the comparator 2 decreases, the output voltage E' of the f/v converter 1 does not become lower than the reference voltage V'$_0$ although it may be lowered by the pulse. The output voltage (the detected signal) of the comparator 2 appearing at the output terminal 2b is held low as shown in FIG. 8(e).

When the frequency of the input pulse signal rises, that is, the period thereof shortens, the output voltage E of the f/v converters 11 lowers each time the input pulse is applied thereto, as shown in FIG. 8(b). When the output voltage E is below the reference voltage V$_0$, the output voltage of the comparator 12 rises as shown in FIG. 8(c). As a result, the reference voltage V$_0$ of the comparator 2 rises, so that it becomes higher than the output voltage E' of the f/v converter 1, as shown in FIG. 8(d). Thereby, the output voltage of the comparator 2 returns from a high level to a low level as shown in FIG. 8(e).

The circuit shown in FIG. 7, as mentioned above, compares the output voltage of the first f/v converter 1 with its reference voltage to sense with excellent response that the frequency of the input signal is below a predetermined value, and then compares the output voltage of the second f/v converter 11 with its reference voltage to produce a stabilized detected signal and to sense that the frequency of the input signal has exceeded the predetermined value.

Figure 9:
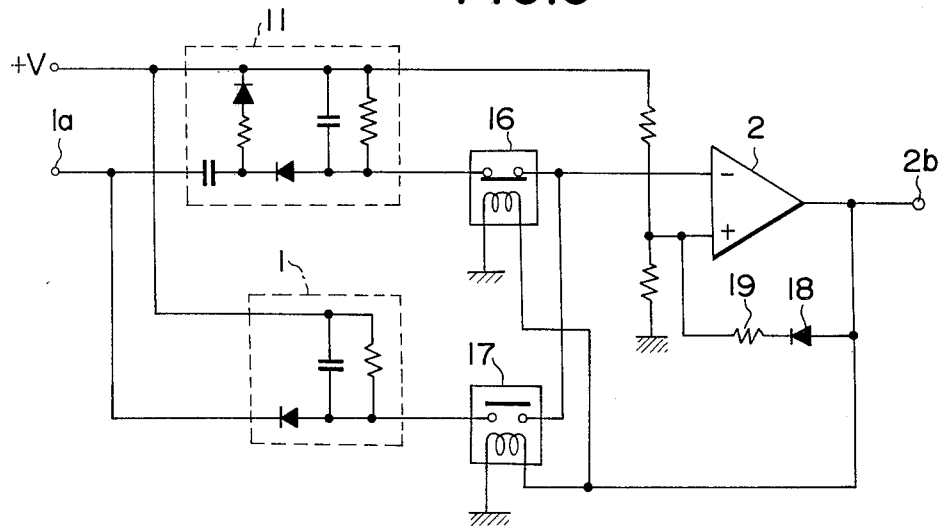
FIG. 9 is a circuit diagram of a second embodiment of the frequency discriminating circuit according to the present invention.

Reference is now made to the second embodiment of the present invention shown in FIG. 9.

This embodiment is characterized by omitting one of the comparators 2 and 12 in the first embodiment and adding instead a normally closed relay 16 and a normally open relay 17. The normally closed relay 16 is connected between the f/v converter 11 and the comparator 2 to open when the output of the comparator 2 is high, and to cut the output of the f/v converter 11. The normally open relay 17 is connected between the f/v converter 1 and the comparator 2 to close when the output of the comparator 2 is high, to apply the output of the f/v converter 1 to the input terminal of the comparator 2. The output of the comparator 2 is applied to the reference voltage terminal (+V) through a diode 18 and a resistor 19.

In this circuit, when a pulse signal is applied to the input terminal 1a, the output voltage of the comparator 2 is high when the frequency of the pulse signal is relatively high. As a result, the normally closed relay 16 opens while the normally open relay 17 closes. In this condition, when the frequency of the input pulse signal lowers, and thereby the output voltage of the f/v converter 1 is above the reference voltage of the comparator 2, the output state of the comparator 2 shifts from high to low to indicate that the frequency has decreased. As a result, the normally open relay 17 opens, and at the same time the normally closed relay 16 closes. Accordingly, the output of the f/v converter 11 is applied to the input terminal of the comparator 2. However, since this output voltage is higher than the reference voltage, the output of the comparator 2 remains stably low.

When the frequency of the input pulse signal becomes higher so that the output voltage of the f/v converter 11 decreases below the reference voltage, the output of the comparator 2 again shifts from the low level to the high level. As a result, the normally closed relay 16 opens, and at the same time the normally open relay 17 closes thereby to apply the output of the f/v converter 1 to the input terminal of the comparator 2.

Briefly, the frequency discriminating circuit according to this embodiment acts to switch the comparison with the reference voltage between the two circuits 1 and 11. Accordingly this makes it possible to promptly sense a decrease in the frequency of the input pulse signal in the first f/v converter 1, and then to switch the comparison to the second f/v converter 11, thereby stabilizing the output of the comparators.

Figure 10:
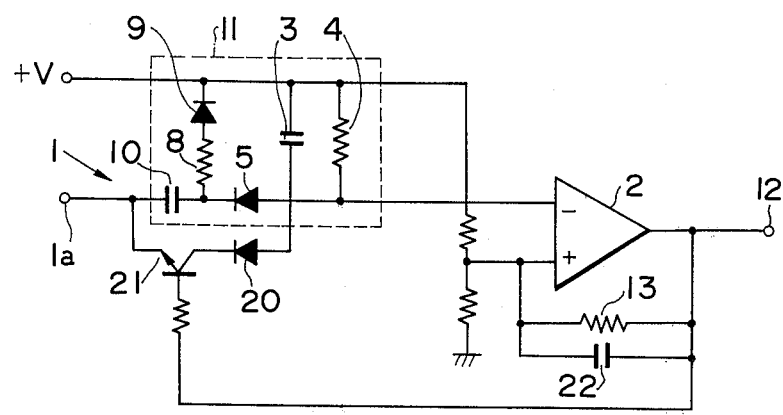
FIG. 10 is a circuit diagram of a third embodiment of the frequency discriminating circuit according to the present invention.

Reference is finally made to the third embodiment of the invention shown in FIG. 10. In this embodiment, a series circuit comprising a diode 20 and a transistor 21 is connected in parallel with the series circuit comprising diode 5 and capacitor 10 in the f/v converter 11. A resistor 13 and a capacitor 22 are connected in parallel between the output terminal and the reference voltage terminal of the comparator 2. The transistor 21 is driven by an output of the comparator 2.

Figure 11:
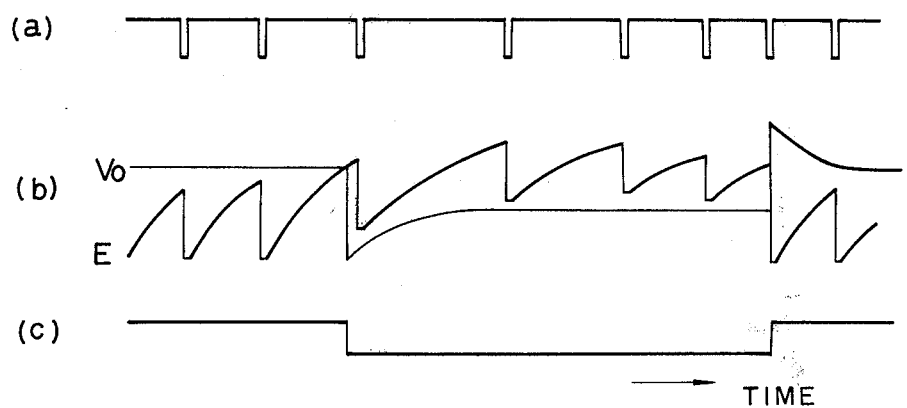
FIG. 11 shows the input/output characteristics of the circuit shown in FIG. 10.

According to this circuit, when the pulse signal shown in FIG. 11 (a) and having a relatively high frequency is applied to the input terminal, the comparator 2 produces a high level voltage to render the transistor 21 conducting. Thus the f/v converter 1 is constituted by the capacitor 3, the resistor 4, and the diode 20.

Then, when the frequency of the input pulse signal lowers and the output voltage E of the f/v converter 1 increases above the reference voltage $V_0$, the output of the comparator 2 goes low to render the transistor 21 non-conducting, in which case, the f/v converter 1 is not formed. The f/v converter 11 becomes operative so that the output voltage E varies as shown in FIG. 11(b).

When the output of the comparator 2 goes low, the capacitor 22 causes the reference voltage $V_0$ to lower temporarily and then to rise to the predetermined value. Accordingly, the output voltage E of the f/v converter 11 does not lower below the reference voltage $V_0$ and the output of the comparator 2 is held at the lower level as shown in FIG. 11(c). When the frequency of the input pulse signal increases, so that the output voltage E of the f/v converter 11 goes below the reference voltage $V_0$, the output of the comparator 2 goes high, thereby rendering the transistor 21 conducting. Thus, the f/v converter 1 is again formed. Accordingly, similarly to the foregoing embodiment, when the frequency of the input pulse signal lowers, the f/v converter 1 detects this change and then the converter 11 stabilizes the output of the comparator 2.

As is clear from the foregoing description, according to the present invention, a decrease in the frequency of the input signal is detected rapidly by comparing the output voltage of the first f/v converter 1 with the reference voltage, and, after this, control is switched to make the comparison between the output voltage of the second f/v converter 11 and the reference voltage. Thereby, by maintaining the output signal, it is possible to sense a frequency decrease with a good response.

Accordingly, if it is required to sense the lowering of an engine rotational speed to return the engine control reliably from the split mode of operation of the engine to the full mode of operation, in a device which controls the number of cylinders supplied with fuel, the circuit according to the present invention can be used as a circuit which detects a decrease in the frequency of a pulse signal corresponding to the rotational speed of the engine.

It will be appreciated by those skilled in the art that the above description of the present invention in terms of three embodiments contains many details which represent adhoc choices and are in no way limitations on the scope of the present invention which is to be defined by the appended claims. For example the polarities of the signals used may of course be changed without departing from the spirit and scope of the invention.

What is claimed is:

1. A frequency discriminating circuit comprising:
   a first signal generating means responsive to an input pulse signal and outputting a first signal of which the peak values vary in response to the frequency of the input signal and the trough values are substantially constant;
   a second signal generating means responsive to the input pulse signal and outputting a second signal of which the trough values vary in response to the frequency of the input signal; and
   a discriminating means responsive to the first and second signals and determining a frequency decrease in the input signal past a predetermined frequency by sensing a peak in the first signal above a first level and determining a frequency increase in the input signal past the predetermined frequency by sensing a trough in the second signal below a second level.

2. The frequency discriminating circuit of claim 1 wherein the first signal generating means comprises a first resistor-capacitor network which generates a signal whose amplitude increases as the period of the input signal increases, and the second signal generating means comprises a second resistor-capacitor network which generates a signal of which both the peak and trough values depend on the period of the input signal.

3. The frequency discriminating circuit of claim 2 wherein the first resistor-capacitor network is coupled to the input signal through a diode in such manner that the troughs of the first signal are substantially directly transmitted from the input signal, and the second resistor-capacitor network is coupled to the input signal through a serial resistor-capacitor network in such manner that only a proportion of a falling edge in the input signal is transmitted to the second signal, so that the depth of each trough in the second signal depends on the height of the preceding peak.

4. The frequency discriminating circuit of claim 1, 2 or 3, wherein the discriminating means comprises a first comparator having a reference input terminal and an input signal terminal receiving the first signal, a second comparator having a reference input terminal and an input signal terminal receiving the second signal, a first resistor connecting the output of the first comparator and the reference input terminal of the second comparator and a second resistor connecting the output of the second comparator and the reference input terminal of the first comparator.

5. The frequency discriminating circuit of claim 1, 2 or 3, wherein the discriminating means comprises a comparator having a reference input terminal connected to a reference input voltage, an input signal terminal and an output terminal, a resistor connecting the reference input terminal and the output terminal of the comparator, and means for selectively connecting the output of either the first or signal generating second means to the input signal terminal of the comparator depending on whether or not the input pulse signal is higher than the reference input voltage of the comparator.

6. The frequency discriminating circuit of claim 5, wherein the means for selectively connecting includes a normally open relay for connecting the output of the first signal generating means to the input signal terminal of the comparator when the input signal is lower than the reference input voltage and a normally closed relay for connecting the output of the second signal generating means to the input signal terminal of the comparator when the input signal is higher than the reference input voltage.

7. A frequency discriminating circuit comprising:
   a signal generating means responsive to an input pulse signal and in response to a switching signal and selectively outputting a first signal of which the peak values vary in response to the frequency of the input signal and the trough values are substantially constant or a second signal of which the trough values vary in response to the frequency of the input signal; and
   a discriminating means responsive to the first or second signal output by the signal generating means and adapted to determine a frequency decrease in the input signal past a predetermined frequency by sensing a peak in the first signal above a first level and responding thereto by transmitting a switching signal to the signal generating means so that the signal generating means switches to output the second signal, the discriminating means being further adapted to determine a frequency increase in the input signal past a predetermined frequency by sensing a trough in the second signal below a second level and responding thereto by transmitting a switching signal to the signal generating means so that the signal generating means switches to output the first signal.

8. The frequency discriminating circuit of claim 7 in which the signal generating means comprises a basic frequency to voltage converter and means for selectively coupling the input signal to the frequency to voltage converter either directly or through a serial resistor-capacitor network according to the switching signal.

9. The frequency discriminating circuit of claim 8 in which the selective coupling means comprises a serial resistor-capacitor network and a switching means in parallel and interposed between the input signal and the frequency to voltage converter such that the switching means selectively bypasses the serial resistor-capacitor network.

10. The frequency discriminating circuit of claim 9 in which the switching means comprises a transistor.

11. A method of frequency discrimination comprising the steps of:
(1) inputting an input pulse signal;
(2) generating a first signal in response to the input signal such that the peak values of the first signal vary in response to the frequency of the input signal, and the trough values of the first signal are substantially constant;
(3) generating a second signal in response to the input signal such that both the peak values and the trough values of the second signal vary in response to the frequency of the input signal;
(4) determining a frequency decrease in the input signal past a predetermined frequency by sensing a peak in the first signal above a first level and determining a frequency increase in the input signal past the predetermined frequency by sensing a trough in the second signal below a second level.

* * * * *